(12) United States Patent
Bollinger

(10) Patent No.: US 7,538,577 B2
(45) Date of Patent: May 26, 2009

(54) SYSTEM AND METHOD FOR CONFIGURING A FIELD PROGRAMMABLE GATE ARRAY

(76) Inventor: Thomas Bollinger, Steinebirker Weg 8, Koblenz (DE) 56072

( * ) Notice: Subject to any disclaimer, the term of this patent is extended or adjusted under 35 U.S.C. 154(b) by 0 days.

(21) Appl. No.: 11/172,092

(22) Filed: Jun. 29, 2005

(65) Prior Publication Data
US 2007/0007998 A1 Jan. 11, 2007

(51) Int. Cl.
G06F 7/38 (2006.01)
H03K 19/173 (2006.01)
H01L 25/00 (2006.01)

(52) U.S. Cl. .............. 326/41; 326/37; 326/38; 326/39; 326/40

(58) Field of Classification Search ............ 326/41
See application file for complete search history.

(56) References Cited

U.S. PATENT DOCUMENTS 6,259,271 B1 * 7/2001 Couts-Martin et al. ........ 326/40
7,193,433 B1 * 3/2007 Young ......................... 326/38
2006/0119384 A1 * 6/2006 Camarota et al. ............. 326/38

* cited by examiner

*Primary Examiner*—Vibol Tan
*Assistant Examiner*—Matthew C Tabler
(74) *Attorney, Agent, or Firm*—West and Associates, A PC; Stuart J. West; Charlotte Rodeen-Dichert (57) ABSTRACT

A mechanism within an electronic system for adapting a field programmable gate array (FPGA) to a flash memory device that supports a synchronous serial peripheral interface (SPI) by coupling a small amount of MSI logic with the FPGA and the flash memory device, to configure the FPGA to a designed configuration state. The system comprises a first and additional FPGAs that support a serial configuration interface, SPI flash memory, and a parallel-load 8-bit shift register. SPI flash memory is initialized with a first configuration data pattern that is read from SPI flash memory and applied to the FPGAs during a first device configuration process resulting in the FPGAs each attaining a designed configuration state. The SPI flash memory is subsequently initialized with a second configuration data pattern by means of the first FPGA. Each FPGA attains another distinct designed configuration state by a second device configuration process.

16 Claims, 5 Drawing Sheets

SYSTEM AND METHOD FOR CONFIGURING A FIELD PROGRAMMABLE GATE ARRAY

FIELD OF THE ART

The present disclosure pertains to a mechanism within an electronic system for adapting a field programmable gate array (FPGA) to a flash memory device that supports a synchronous serial peripheral interface (SPI) by means of coupling a small amount of MSI logic to the FPGA and the flash memory device.

BACKGROUND

A field programmable gate array (FPGA) is a programmable logic device comprising an array of logic circuits whose functions are determined by the state of configuration memory that also resides within the device. FPGAs can be incorporated into printed circuit board assemblies, and are used in a wide variety of electronic systems.

The configuration memory within a typical FPGA is volatile. Thus, there is a need to configure the FPGAs within a given system. That is, the FPGA must load the configuration memory each time the system power is restored in order for the system to benefit from the intended functionality of the FPGAs. An FPGA configured in such a manner achieves a designed configuration state in which it performs logic and other functions that are specified in a particular design.

Some specific FPGA types provide a number of distinct alternative methods, known as modes, to configure the device. Of particular interest are serial modes that include support for receiving configuration information through a serial port connection to the FPGA. These serial modes support coupling between a FPGA and specific non-volatile integrated circuit (IC) memories. Some manufacturers have offered specific IC memories that directly support corresponding specific FPGA serial modes, in the circumstance where both the FPGA and the IC memory are specifically identified products of a common manufacturer.

When designing a system containing one or more FPGAs with volatile internal configuration memory, a designer may choose to integrate a non-volatile external memory IC whose functions include storing configuration data patterns that map to desired designed configuration states of the FPGAs. The external memory IC can be called upon to provide the contents of its memory during a device configuration process. The non-volatile external memory IC can be a one-time-programmable device (OTP), or commonly, a re-programmable device such as an EEPROM or flash memory. The capability to be programmed more than once is an advantage in systems where ongoing changes to the FPGA design are desired or required. This reprogramming capability is of particular advantage when it is accomplished by software means without need for an operator to physically access the memory device.

In general, flash memory devices provide a speed advantage in programming and reprogramming over traditional EEPROM technologies. Additionally, flash memory devices are manufactured in large volumes due to product penetration into cellular phones, mp3 players, and other consumer electronic devices and thus tend to be readily available. Moreover, high volume production tends to lower memory IC costs, and also tends to lower the cost per memory bit. Multiple vendors of flash memory are able to supply parts with compatible interfaces; such competition also tends to lower prices and lead to technology enhancements.

Flash memory devices that support a synchronous serial peripheral interface (SPI) are of particular interest to designers, because the SPI may be adapted to the serial modes supported by particular FPGA product families.

The introduction of another programmable logic device, the CPLD, into the system design, in order to adapt the FPGA serial mode to SPI flash memory, is problematic. A design for the CPLD configuration must be provided and maintained, and a method for configuring the CPLD must be included when building up one or more systems. Although SPI flash memory provides advantages to the system design in terms of cost and function over other specialized memory alternatives, this advantage is reduced by the cost of providing and configuring the CPLD.

Accordingly, an alternate means of adapting FPGAs to SPI flash memory is needed.

SUMMARY

FPGAs that are members of some FPGA product families provide configuration modes that support a serial interface, including by way of example and not limitation Xilinx Spartan-II™, Spartan-IIE™, and Spartan III™ product families. Some flash memory ICs support a Serial Peripheral Interface (SPI), including by way of example and not limitation Silicon Storage Technology SST25LF020A and SST25LF040A. Prior art teaches using a complex programmable logic device (CPLD) as means for adapting FPGAs to SPI flash memory for the device configuration process. In one circuit system embodiment comprising an FPGA IC and a SPI flash memory IC, a single medium scale integration logic (MSI) IC can provide an improved means for adapting an FPGA to SPI flash memory for the FPGA device configuration process, without the CPLD. In some embodiments, the MSI IC can be an eight-bit shift register. However in alternate embodiments, the MSI IC can be any known and/or convenient logical block of any convenient dimension.

An MSI shift register provides many advantages over a CPLD, including reduced relative cost and complexity. A CPLD itself requires configuration in order to function as desired; this configuration in turn requires a design for the functional configuration of the part, and, requires a means for configuring a physical CPLD for each physical realization of the circuit. In short, the CPLD can require programming, as compared to an MSI shift register which can be simply connected in circuit in order to function as desired.

In one embodiment a SPI flash memory IC can contain a configuration data pattern that maps to a designed configuration state for a single FPGA in the circuit. The FPGA can attain the designed configuration state by means of a device configuration process, the process can include reading out the contents of the flash memory by sequential addresses, and providing this data stream as configuration input data to the FPGA.

FPGAs that are members of FPGA product families herein described can also support serial port interconnections between FPGAs for the purpose of configuring multiple FPGAs from a single serial data input source. Two or more FPGAs can be linked together directly by means of their serial configuration ports. The two or more linked FPGAs can be configured by a data stream provided by a single SPI flash memory IC. That is, the single configuration data pattern stored in the SPI flash memory maps to distinct designed configuration states for all of the two or more FPGAs that are linked together. A device configuration process results in each of the two or more linked FPGAs attaining distinct designed configuration states. In this case, the FPGAs in the circuit can comprise distinctly different FPGA products.

The SPI flash memory contains an appropriate configuration data pattern prior to a device configuration process, in order for the FPGA or FPGAs to attain the desired designed configuration states. That is, the SPI flash can be initialized or programmed to contain a configuration data pattern. The present invention allows for several alternative methods for this initialization. A SPI flash memory IC can be initialized to contain a configuration data pattern prior to assembly of a printed circuit board embodiment. In one embodiment, a 3-state bus buffer and a programming port are provided, and the SPI flash can be initialized after assembly by means of operation of signals comprising the programming port. Another method of initializing the SPI flash after printed circuit board assembly is by means of in-circuit test (ICT) equipment. In these embodiments it is also possible to initialize the SPI flash memory by the operation of user I/O signals operating through the FPGA. That is, following a device configuration process that reads a first configuration data pattern from the SPI flash, the FPGA attains a first designed configuration state. That first designed configuration state provides for operation of configured user input/output pins to program the SPI flash memory with a second configuration data pattern. The second configuration data pattern results in the FPGA attaining a second designed configuration state following another device configuration process.

BRIEF DESCRIPTION OF THE DRAWINGS

The above, and other objects, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION

Reference will now be made in detail to one or more preferred embodiments, examples of which are illustrated in the accompanying drawings. Wherever convenient, the same reference numbers will be used throughout the drawings to refer to the same or like parts. For the purpose of example, numerous specific details are set forth in the following description. For the purpose of clarity, technical material that is known in the technical fields related to the disclosure has not been described in detail so that the present disclosure is not unnecessarily obscured. Other embodiments will be apparent to those skilled in the art from consideration of the specification and practice disclosed herein. The present invention may be practiced according to the claims without some or all of these specific details. It is intended that the specification and examples be considered as exemplary only, with the true scope of the invention being indicated by the following claims and equivalents.

Figure 1:
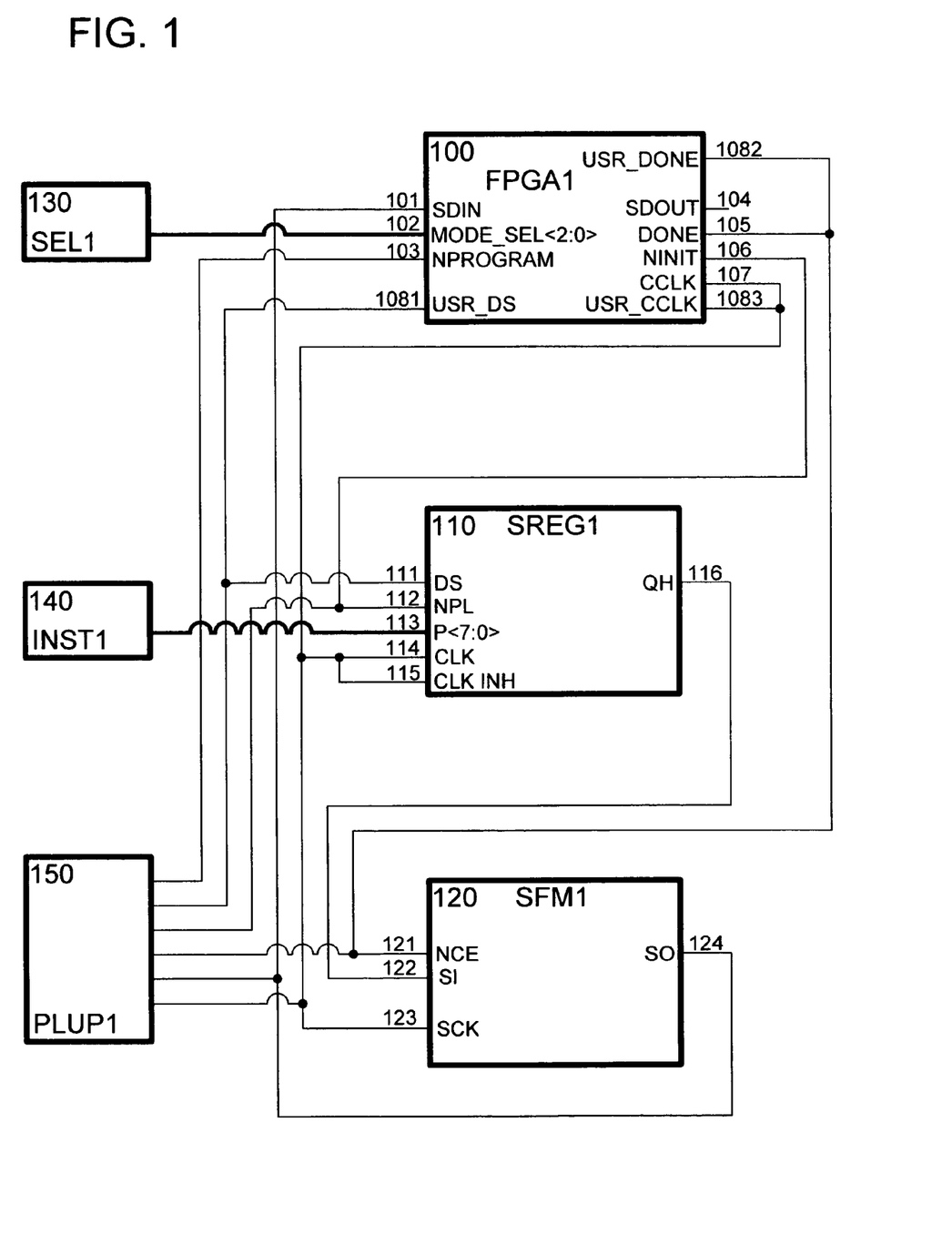
FIG. 1 is a schematic diagram of a single FPGA adapted to SPI flash.

FIG. 1 is a schematic diagram of one embodiment of a system for configuring a field programmable gate array. Signals relevant to a device configuration process are shown on a field programmable gate array FPGA1 100. In some embodiments, FPGA1 can be a specified field programmable gate array, such as a Xilinx XC2S200 and/or any known and/or convenient field programmable gate array that supports a serial mode device configuration process. In the embodiment shown in FIG. 1, SREG1 110 can be a parallel-load shift register. In some embodiments, SREG1 110 can be an 8-bit shift register. However, in alternate embodiments SREG1 110 can be any known and or convenient shift register and/or mechanism having any known and/or convenient dimensions and/or capacities.

In some embodiments, SREG1 110 can be a specific shift register, such as a Texas Instruments 74LV165A. However in alternate embodiment, any device capable of performing the same function can be used. In the embodiment shown in FIG. 1, SFM1 120 can be a flash memory device capable of providing support for the SPI interface. In some embodiments, SFM1 120 can be a Silicon Storage Technology SST25LF020A. However in alternate embodiments, SFM1 120 can be any memory device capable of providing support for the SPI interface.

In the embodiment shown in FIG. 1, the PLUP1 150 block can contain resistors in a standard "pull-up" configuration. Every attached signal is coupled with an independent pull-up resistor in the PLUP1 150 block, and each coupling can provide a high, that is, positive, logic state to a signal under the condition that the signal is not otherwise being driven to a defined logic state. In the embodiment shown in FIG. 1, the SEL1 130 block can provide specific logic levels for each of the mode select inputs of the FPGA, that is, for MODE-_SEL<2:0> 102. The INST1 140 block can provide specific logic levels for each of the parallel-load input pins P<7:0> 113 of the shift register SREG1 110. In one embodiment, the circuits shown in FIG. 1 can operate with mutually compatible logic levels and power supplies.

In one embodiment shown in FIG. 1, SFM1 120 can contain a configuration data pattern that can map to a desired design configuration state for the field programmable gate array, FPGA1 100. The flash memory contents can be initialized to a desired state prior to the field programmable gate array device configuration process. In alternate embodiments, any known and/or convenient method and/or system for initializing flash memory contents can be employed. In still further alternate embodiments, the flash memory contents may not be initialized or can be received in an initialized state.

By way of example, consider a printed circuit board assembly with the circuits of FIG. 1 attached thereto. SFM1 120 can be in the form of an integrated circuit package whose contents can be programmed to a desired state by means of a standalone and/or integrated programming device. The SFM1 120 IC package can be coupled with the programming device, programmed with the desired configuration data pattern, and thereafter dissociated or left in-situ, whereupon it can be coupled with the printed circuit board.

Another example method for initializing SFM1 120 is by means of in-circuit programming. Once again consider some embodiments comprising a printed circuit board assembly with the circuits of FIG. 1 attached thereto. In this example the SFM1 120 IC package can be attached to the printed circuit board assembly prior to receiving its programming. Using straightforward techniques implemented in the system electrical design, techniques that can be summarized as "design for testability", individual circuit nodes can be isolated and activated by in-circuit test equipment. The in-circuit test equipment is sometimes referred to as ICT or ATE equipment This equipment can receive the fully assembled printed circuit board assembly and can act upon the assembly. By providing a pre-determined sequence of electrical events to the flash memory component in this manner, the flash memory contents can be programmed with a desired configuration data pattern.

Figure 2:
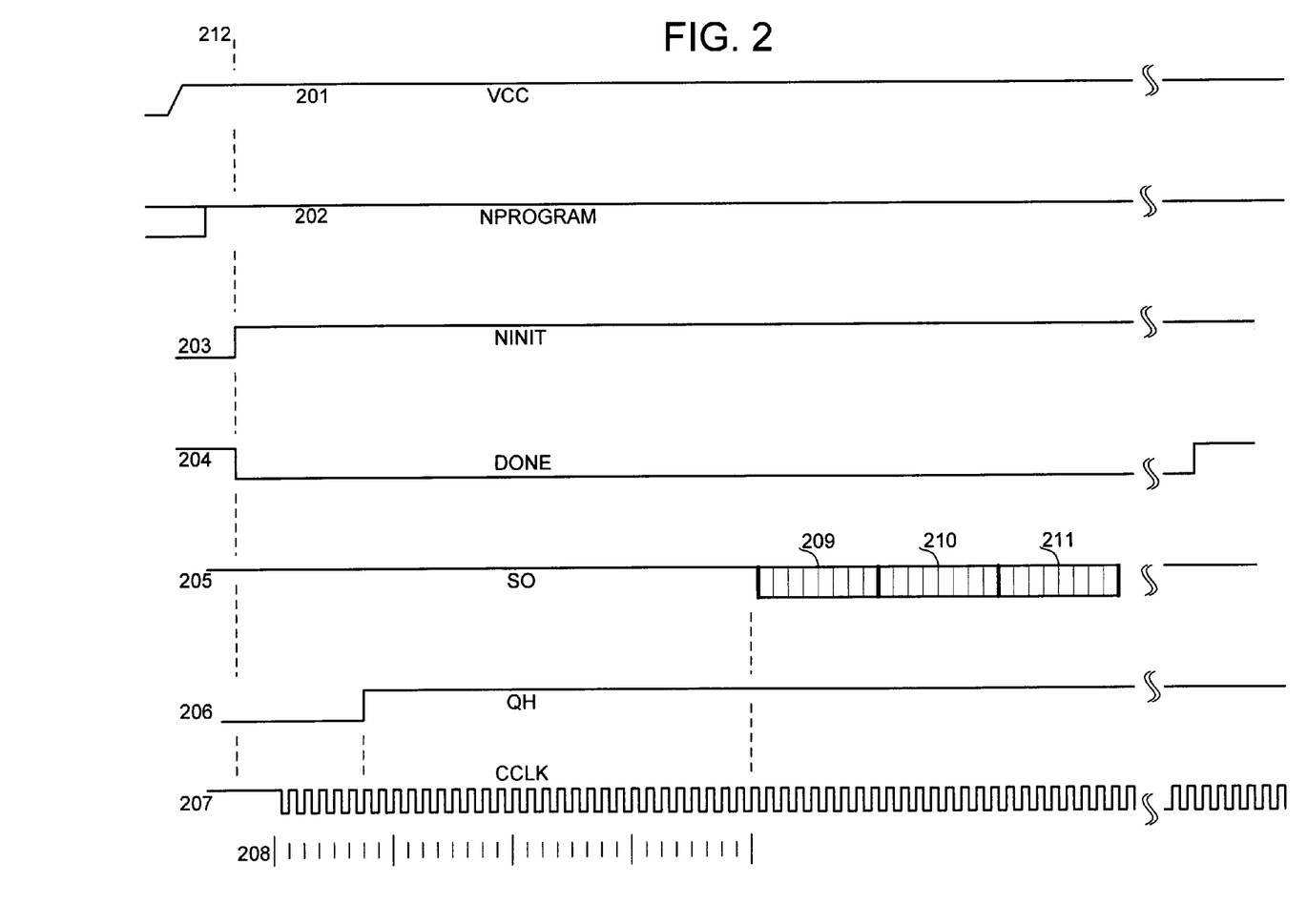
FIG. 2 is a timing diagram illustrating a device configuration.

FIG. 2 is an exemplary timing diagram for a device configuration process occurring in the circuit embodiment of FIG. 1. Time increases from left to right in FIG. 2. System power is represented as the VCC 201 waveform. The low-to-high transition of VCC indicates that suitable operating voltages are applied to the circuit elements of interest. In short, the system is powered up.

FPGA1 100, in the absence of receiving a low logic level assertion on its NPROGRAM 103 input, responds to system power-up by causing transitions on both NINIT 106 and DONE 105 outputs, to low and high logic levels, respectively. Waveform representations of NPROGRAM 202, NINIT 203, and DONE 204 are shown in FIG. 2. (NINIT and NPROGRAM in this writing correspond respectively to $\overline{\text{INIT}}$ and $\overline{\text{PROGRAM}}$ in some Xilinx FPGA documentation.)

The FPGA1 NINIT 106 output is coupled with the parallel load enable NPL 112 input of SREG1 110. The shift register SREG1 110 responds to the rising edge of NINIT with a parallel load; the individual bit registers of the eight-bit shift register each take on the value of their respective bit inputs P<7:0> 113. In this example inputs P<7:0> 113 are hardwired by means of circuit block INST1 140 to represent hexadecimal 03, that is, 03h, equivalent to binary 00000011.

Continuing with the device configuration process, FPGA1 100 samples its MODE_SEL<2:0> 102 input pins, using that information to select a configuration mode. In this example, the configuration mode selected comprises using a serial port of FPGA1 100 to input configuration information, and, providing for FPGA1 100 to drive a system clock output CCLK 107. This mode is Serial Master Mode.

FPGA1 100 subsequently drives CCLK 107 as an output clock signal; an exemplary waveform is shown as CCLK 207.

The clock input of the shift register SREG1 110 is coupled with the FPGA1 CCLK 107 output. CCLK 107 is also coupled with a FPGA user I/O pin USR_CCLK 1083, but user I/O pins are not enabled, that is, they remain in a high-impedance condition throughout the device configuration process. At each rising edge of CCLK, the shift register SREG1 110 advances the serial position of information in the serial shift register by one bit. FIG. 2 provides an alignment grid 208 that shows how the individual bits shifting out of the shift register's serial output QH 116, shown as the waveform QH 206, can be organized into groups of 8 bits. The first 8-bit group shown has the value 03h; this information was parallel-loaded at the rising edge 212 of NINIT. The serial input to the shift register DS 111 is coupled with a high logic level at PLUP1 150 in the circuit of FIG. 1, so all shift-register output following the first parallel-loaded 8-bit value is at a high logic level. In 8-bit terms, the value of all subsequent 8-bit output bytes of the shift register is FFh. DS 111 is also coupled with a FPGA user I/O pin USR_DS 1081 that remains disabled throughout the device configuration process.

CCLK107 is coupled with the clock input SCK 123 of SFM1 120. FPGA1 output DONE 105 is coupled with the chip enable input NCE 121 of SFM1 120. DONE 105 is also coupled with a FPGA user I/O pin USR_DONE 1082 that remains disabled throughout the device configuration process. The shift register output QH 116 is coupled with the serial input SI 122 of the flash memory SFM1.

SFM1 chip enable input NCE 121 receives a low input responsive to FPGA1 asserting DONE 105 low throughout the device configuration process. While the serial flash memory is thus enabled, the value 03h is clocked into its serial port SI 122 as a result of the onset of CCLK207 and the QH 206 output values of SREG1 110, as shown in figure 2. This indicates a read instruction to the serial flash memory SFM1 120, which then interprets the next three 8-bit bytes of serial input data as the first read address. It may be appreciated that in some embodiments SPI flash memory SFM1 120 requires a specific minimum time delay between power-up and the high-to-low transition of its NCE 121 chip enable input, in order to successfully perform a read instruction.

As noted above, all serial data output from the shift register, hence input at SI 122 to SFM1 120, is at a high logic level subsequent to the 03h value. Thus the first read address is the highest addressable location in the serial flash memory. SFM1 120 provides the data read from memory on its serial data output pin, SO 124, whose waveform is shown in FIG. 2 as SO 205. The first 8-bit output value 209 follows the first falling edge of CCLK 207, immediately after the last read instruction address bit (1, a high level) was clocked into SFM1 120 on the rising edge of CCLK.

The read address counter within flash memory SFM1 120 rolls over, resulting in a read of the next 8-bit output from the lowest address in the memory; that is, address 0. The resultant read data 210 is output immediately after the previous 209 value. The address counter continues to advance; the next data output 211 is from read address 1. This process continues, with the internal address counter advancing, and read data emanating from SFM1 120 serial output SO 124, until the chip enable input NCE 121, responsive to the DONE 105 output signal of FPGA1 100, goes to a high logic level, terminating execution of the read instruction.

During the device configuration process, the serial data output SO 124 of SPI flash memory 120 appears as serial data input to FPGA1 100 on serial configuration data input node SDIN 101. FPGA1 100 parses the data input, that is, parses the serial bitstream input to SDIN 101. The bitstream is interpreted as a sequence of 32-bit words. A bitstream for a useful configuration data pattern for some FPGAs typically begins with two or more dummy words, each having a value of FFFFFFFFh. These are followed immediately by a synchronization word, AA995566h. The bitstream appearing between the delimiting symbols discussed here is organized into packets, which are groups of 32-bit words. The designed input concludes with packets that invoke a cyclic redundancy check (CRC) upon the recently loaded configuration data, followed by four dummy words each having a value of 00000000h. Upon successful conclusion of the CRC, the FPGA essentially asserts DONE 105 high by releasing its open-drain drive, allowing that signal to return to a high logic level as shown in DONE waveform 204, responsive to a pull-up network in PLUP1 150.

Note that in some embodiments the size of a usable configuration data pattern must be smaller than the size of the SPI flash memory in which it is stored. Another necessary condition in some embodiments is that the portion of SPI flash memory with addresses greater than the region in which the pertinent configuration data resides must have contents initialized to FFh, so that serial configuration input data to FPGA1 is dummy words FFFFFFFFh both prior to, and after, the data of interest. In some embodiments, the number of valid address locations provided above the configuration data can have an operating range with a minimum value. The minimum value is set to be large enough to prevent an SPI flash memory address wrap-around to zero in the SPI flash read cycle during the critical time period after the last delimiting symbol of the desired configuration data pattern is read from SFM1 120 but before FPGA1 100 completes a CRC check and responsively essentially asserts DONE 105 to a high logic level. DONE 105 is coupled with the chip enable input NCE 121 of SFM1 120, so the high assertion of DONE 105 can deselect SFM1 120, ending the read cycle. If the SPI flash memory read address were to wrap-around to zero during that critical period, FPGA1 100 could receive serial input data symbols indicative of the beginning of another device configuration process, prior to the successful completion of a first process. This can create an undesirable circumstance that is outside specified protocols for some FPGA devices.

The SPI flash memory SFM1 120 can be initialized by the operation of user input/output (I/O) signals operating through FPGA1 100. That is, following a device configuration process that reads a first configuration data pattern from the SPI flash memory 120, FPGA1 100 can attain a first designed configuration state. That first designed configuration state can provide operation of configured user I/O pins to program the SPI flash memory with a second configuration data pattern. The user I/O connections do not interfere with the first device configuration process because all user I/O signals remain disabled throughout the device configuration process.

In FIG. 1, USR_DS 1081 is a user I/O pin of FPGA1 100 coupled with the serial data input DS 111 of shift register SREG1 110. USR_DONE 1082 is a user I/O pin coupled with the dedicated DONE 105 signal of FPGA1 100 and the chip enable input NCE 121 of SFM1 120. USR_CCLK 1083 is a user I/O pin coupled with the dedicated CCLK 107 signal of FPGA1 100 and clock inputs of SREG1 110 and SFM1 120. NINIT 106 of FPGA1 100, coupled with the parallel load enable NPL 112 of SREG1 110, can also be configured as a user I/O after its dedicated use during a device configuration process. The combined operation of these four user I/O signals: USR_DS 1081, USR_DONE 1082, USR_CCLK 1083 and NINIT 106 provide control over SREG1 110 and SFM1 120 in order to initialize SFM1 120 with a second configuration data pattern. In one embodiment, the user I/O signals and associated configured logic within FPGA1 100 can be responsive to commands transmitted from a system computer coupled with a computer interface, the computer interface having been incorporated into the designed configuration state of FPGA1 100. The second configuration data pattern contained in SFM1 120 results in FPGA1 100 attaining a second designed configuration state following another device configuration process.

In the above example the serial configuration data output node SDOUT 104 is shown without coupling to other circuit elements. In some embodiments, the serial configuration data output node SDOUT 104 has substantially similar function to that of a FPGA configurable user I/O following a device configuration process, when the I/O drivers may be enabled.

It may be appreciated that other memory devices supporting an SPI interface may be successfully substituted for the serial flash memory device shown in FIG. 1.

Figure 3A:
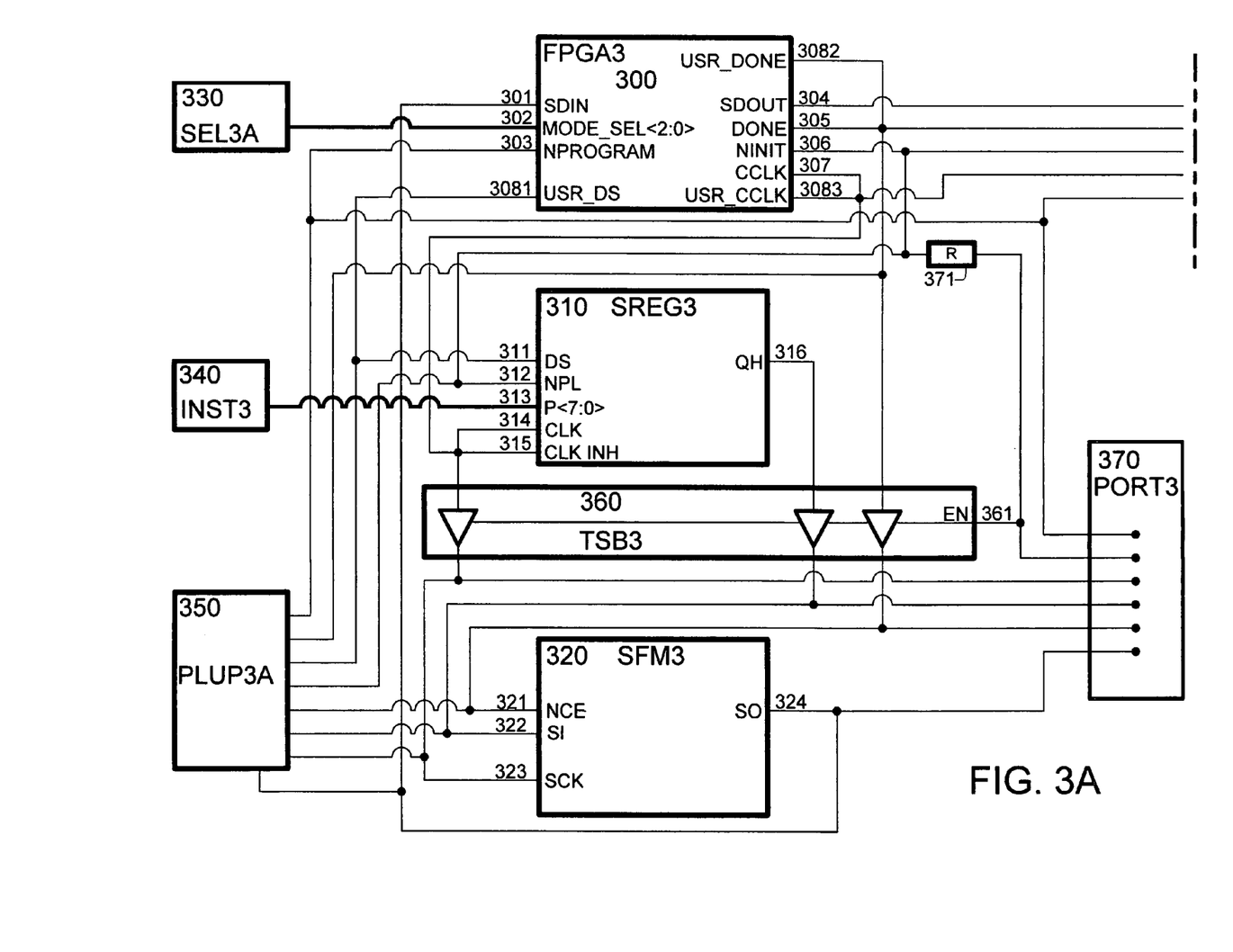
FIG. 3A is a schematic diagram of a single FPGA adapted to SPI flash memory, including circuit means for alternative initializing of SPI flash memory.

The circuit shown in FIG. 3A comprises elements and functions substantially similar to the circuit shown in FIG. 1 and previously described. Specifically, the functions and connections of FPGA1 100 correspond to FPGA3 300, SREG1 110 similarly corresponds to SREG3 310, and SFM1 120 similarly corresponds to SFM3 320. The SEL3 330 block provides specific logic levels for MODE_SEL<2:0> 302 as SELL 130 provides for MODE_SEL<2:0> 102 in FIG. 1. The INST3 340 block provides specific logic levels for each of the parallel-load input pins P<7:0> 313 of the shift register SREG3 310 as INST1 140 does for P<7:0> 113 of SREG1 110 in FIG. 1. The pull-up network PLUP3A 350 in the circuit of FIG. 3A provides a pull-up function to individual nets as shown, as does PLUP1 150 in FIG. 1.

In FIG. 3A the SPI flash memory SFM3 320 serial output SO 324 is coupled with the serial configuration data input node SDIN 301 of FPGA3 300, as in FIG. 1 SO 124 is coupled with SDIN 101. In FIG. 3A FPGA user I/O pin USR_DS 3081 is coupled with shift register input DS 311, as in FIG. 1 USR_DS 1081 is coupled with DS 111. In FIG. 3A NINIT 306 is coupled with NPL 312, as in FIG. 1 NINIT 106 is coupled with NPL 112.

A 3-state bus buffer TSB3 360 is interposed between signal sources and the inputs NCE 321 SI 322 SCK 323 to SPI flash memory SFM3 320. In one embodiment, TSB3 360 is a Texas Instruments 74LVC126A. While EN 361 is at a high logic state, TSB3 360 is enabled, and the buffer simply buffers signal sources. While TSB3 360 is enabled, SI 322 input receives the buffered output of QH 316, which is logically equivalent to the unbuffered coupling between SI 122 and QH 116 shown in FIG. 1. Similarly, NCE 321 input receives a buffered version of any signal present on the coupled net of DONE 305 and USR_DONE 3082, which is logically equivalent to the unbuffered coupling amongst DONE 105, USR_DONE 1082, and NCE 121 shown in FIG. 1. Similarly, SCK 323 input receives a buffered version of any signal present on the coupled net of CCLK 307 USR_CCLK 3083, CLK 314, and CLK_INH 315, which is logically equivalent to the unbuffered coupling amongst CCLK 107, USR_CCLK 1083, CLK 114, CLK_INH 115, and SCK 123 shown in FIG. 1.

Initialization of SFM3 320 with a configuration data pattern can be accomplished through every manner described above to initialize SFM1 120 with a configuration data pattern, using the circuits of FIG. 3 in substantially similar ways as described for FIG. 1.

FPGA3 300 can attain a designed configuration state through a device configuration process that reads a configuration data pattern from SFM3 320 in a manner substantially similar to that described above for configuring FPGA1 100 from the contents of SFM1 120.

In one embodiment, a programming port PORT3 370 in FIG. 3A provides connections for initializing SFM3 320 by programming means external to the illustrated circuit. PORT3 370 can take the form of an electrical connector coupled with a printed circuit board. The external programming means can be a computer system with an attached probe that mates to the electrical connector of PORT3 370. The external programming means can assert EN 361 low, disabling the 3-state bus buffer 360 outputs, hence becoming free to operate the SCK 323, SI 322, and NCE 321 inputs directly to program and otherwise operate on SFM3 320. The external means can operate upon SFM3 320 with any of a plurality of supported SPI protocol functions including, by way of example and not limitation for the Silicon Storage Technology SST25LF020A and SST25LF040A: Read, High-Speed-Read, Sector-Erase, Block-Erase, Chip-Erase, Byte-Program, Auto Address Increment Single-Byte Program, Read-Status-Register, Enable-Write-Status-Register, Write-Status-Register, Write-Enable, Write-Disable, and Read-ID.

Other additional functionality attends to the addition of PORT3 370 to the circuit of FIG. 3A. The NPROGRAM 303 input to FPGA3 300 can be controlled from PORT3 370 to initiate a device configuration process. This provides an alternative to the system power-up event, previously described, to initiate the process. When using PORT3 303 to operate NPROGRAM 303 for this purpose, EN 361 can be asserted to a high logic level, or pulled-up, so that NCE 321, SI 322, and SCK 323 remain responsive to signals from FPGA3 300 and SREG3 310. PORT3 370 can also support observability of the signals that it contains. For example, the signals coupled with and including NINIT 306 are observable through resistor R 371, at PORT3.

Figure 3B:
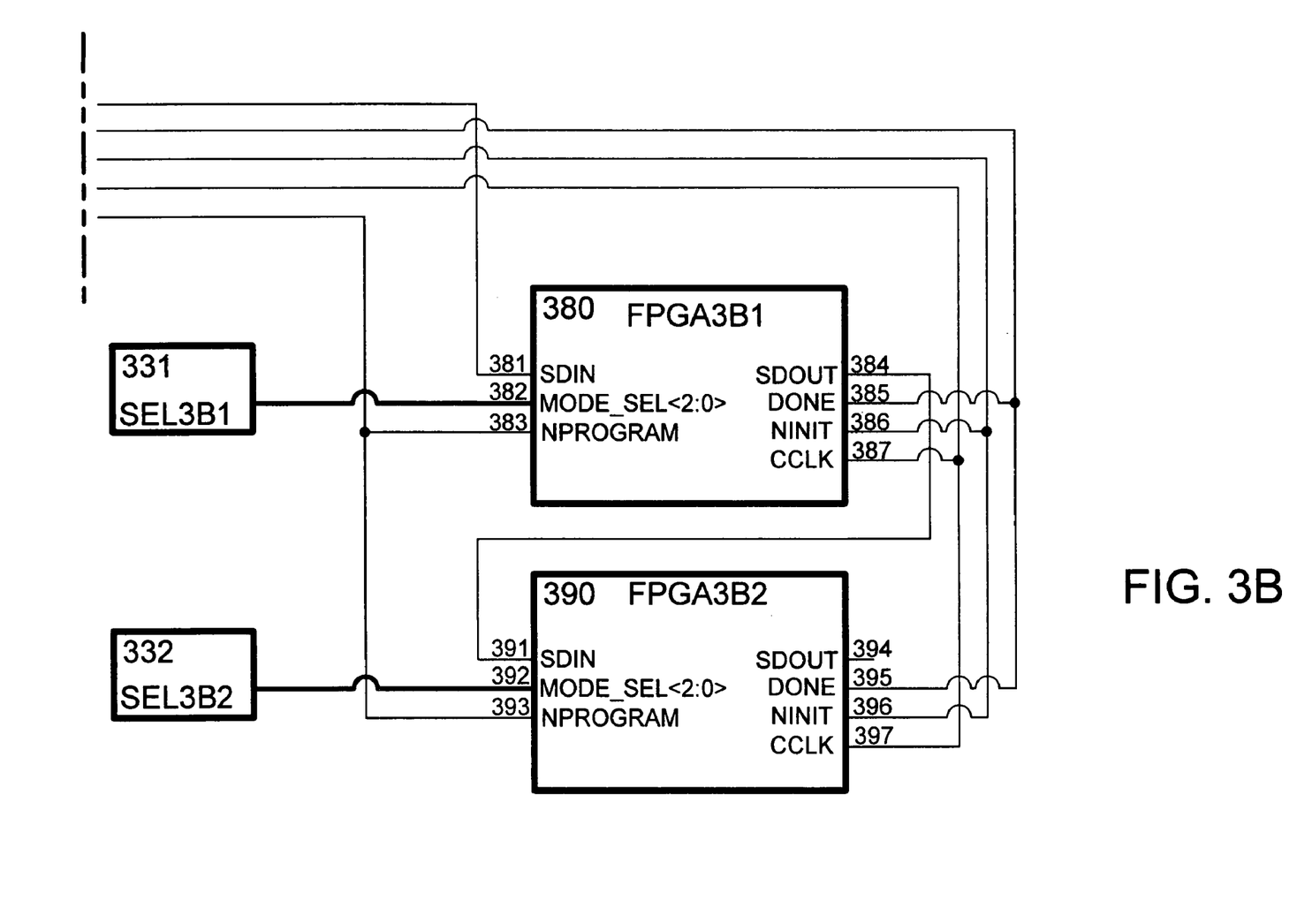
FIG. 3B is a schematic diagram of additional FPGAs disposed in a serial daisy-chain with the FPGA of FIG. 3A.

FIG. 3B illustrates an embodiment containing the addition of one or more additional FPGAs disposed in a serial daisy-chain. The serial configuration data output node SDOUT 304 of FPGA3 300 of FIG. 3A is coupled with the serial configuration data input node SDIN 381 of FPGA3B1 380 of FIG. 3B. Similarly, SDOUT 384 of FPGA3B1 380 is coupled with SDIN 391 of FPGA3B2 390 in FIG. 3B. Although specifically two additional FPGAs are provided for illustration in FIG. 3B, forming a chain of three FPGAs, it may be appreciated that a chain of two, or a chain of more than three, can be similarly linked together in other embodiments. The serial configuration data output node SDOUT 394 of FGA3B2 390 is shown without further connection, but it may be appreciated that it can be coupled to the serial configuration data input node of another additional similarly disposed FPGA, in another embodiment.

NPROGRAM signal inputs 383 to FPGA3B1 380 and 393 of FPGA3B2 390 are connected in common with NPROGRAM input 303 to FPGA3 300.

DONE 385 and 395 are connected in common with DONE 305 of FPGA3 300 of FIG. 3A.

NINIT 386 and 396 are connected in common with NINIT 306 of FPGA3 300 of FIG. 3A.

CCLK 387 and 397 are connected in common with CCLK 307 of FPGA3 300 of FIG. 3A.

The SEL3B1 331 block provides specific logic levels for the mode select inputs of FPGA3B1 380, that is, for MODE_SEL<2:0> 382. The SEL3B2 332 block provides specific logic levels for the mode select inputs of FPGA3B2 390, that is, for MODE_SEL<2:0> 392.

FPGA parts selected from the Xilinx FPGA product families herein described can be serially daisy-chained for configuration as shown. The first FPGA in the chain, FPGA3 300 is disposed to use Serial Master Mode as its configuration mode. All other FPGAs in the chain, here FPGA3B1 380 and FPGA3B2 390 are disposed to use Serial Slave Mode. In this example, SEL3B1 331 and SEL3B2 332 each provide the appropriate inputs for selecting Serial Slave Mode to MODE_SEL<2:0> 382 and 392, respectively.

During the device configuration process, CCLK 387 and 397 serve as clock inputs to the FPGAs that are in Serial Slave Mode; these inputs can be driven by the clock output CCLK 307 from the FPGA that is in Serial Master Mode. Each of the FPGAs drives their corresponding DONE outputs as an open-drain signal, and the combined net is pulled-up through a resistor network. The result is a wired-AND circuit; only when none of the DONE outputs is driving a low level will the result be a high logic level. The common connection for DONE will not return to a high logic level after the beginning of a device configuration process until each of the chained FPGAs successfully completes their respective CRC checks and ends their output drive of DONE to a low logic level. As is the case for DONE, each of the FPGAs can drive their corresponding NINIT outputs as an open-drain signal, and the combined net is pulled-up through a resistor network. The combined NINIT net will transition from a low to a high logic level at the onset of the device configuration process. The NINIT output of each FPGA is responsive to internal completion of a configuration memory clearing step; until each FPGA has finished that step the NINIT combined net will remain in a low logic state. As each FPGA completes the clearing step, it will stop asserting the corresponding open-drain output, allowing NINIT to transition to a high logic state upon the completion of the clearing step of the latest of the FPGAs.

All of the FPGAs in the serial daisy-chain, FPGA3 300, FPGA3B1 380, and FPGA 3B2 390 attain distinct designed configuration states upon the completion of a single, combined, device configuration process that reads a single, combined, configuration data pattern from SFM3 320. SFM3 320 is initialized with a configuration data pattern that combines the configuration data patterns that each map to a distinct designed configuration state for a corresponding FPGA in the serial daisy-chain of FPGAs. The combined configuration data pattern can be generated by using software tools provided by an FPGA manufacturer acting upon the set of individual configuration data patterns that are to be combined.

The first FPGA FPGA3 300 in the chain attains a designed configuration state resulting from a first portion of the configuration data pattern that is read from SFM3 320 during the device configuration process. When the first FPGA has completed its configuration, it allows the next portions of the configuration data pattern to flow through to the second FPGA in the chain, FPGA3B1 380. The serial configuration data flows synchronously to the CCLK combined net, out through the connected serial configuration data output node of one FPGA and into the serial configuration data input node of the next FPGA in the chain. That is, serial configuration data flows out of FPGA3 300 SDOUT 304 into FPGA3B1 380 SDIN 381, out of FPGA3B1 380 SDOUT 384 into FPGA3B2 390 SDIN 391. When the first FPGA in the chain completes its configuration it releases the open-drain drive asserting DONE 305 low. The second FPGA in the chain, FPGA3B1 380, similarly completes its configuration, releases DONE 385, and allows the serial configuration data to flow to the third FPGA, FPGA3B2 390. The third FPGA similarly completes its configuration, releases DONE 395, and thus terminates the device configuration process. The example provided here shows three FPGAs disposed in a serial daisy-chain; it may be appreciated that a combination of two FPGAs or more than three FPGAs, similarly disposed in a serial daisy-chain, are alternative embodiments.

Note again that for some embodiments the size of a usable, single, combined configuration data pattern must be smaller than the size of the SPI flash memory in which it is stored. In some embodiments the number of valid address locations above the combined configuration data can have an operating range with a minimum value. The minimum value is set to be large enough to prevent an SPI flash memory address wrap-around to zero in the SPI flash read cycle during the critical time period after the last delimiting symbol of the combined configuration data pattern is read from SFM3 320 but before the last FPGA in the chain of FPGAs completes a CRC check and responsively essentially asserts DONE 395 to a high level. In some embodiments comprising serially daisy-chained FPGAs, there is an additional pipeline delay due to the propagation of serial configuration data through the FPGAs. This pipeline delay can extend the length of the critical time period just described.

It may be appreciated that the circuit of FIG. 1 can be augmented with a serial daisy-chain of FPGAs in a substantially similar manner to that described here for FIGS. 3A and 3B. A serial daisy-chain topology does not require the 3-state bus buffer 360 element nor does it require the programming port 370 element shown in FIG. 3A.

Figure 4:
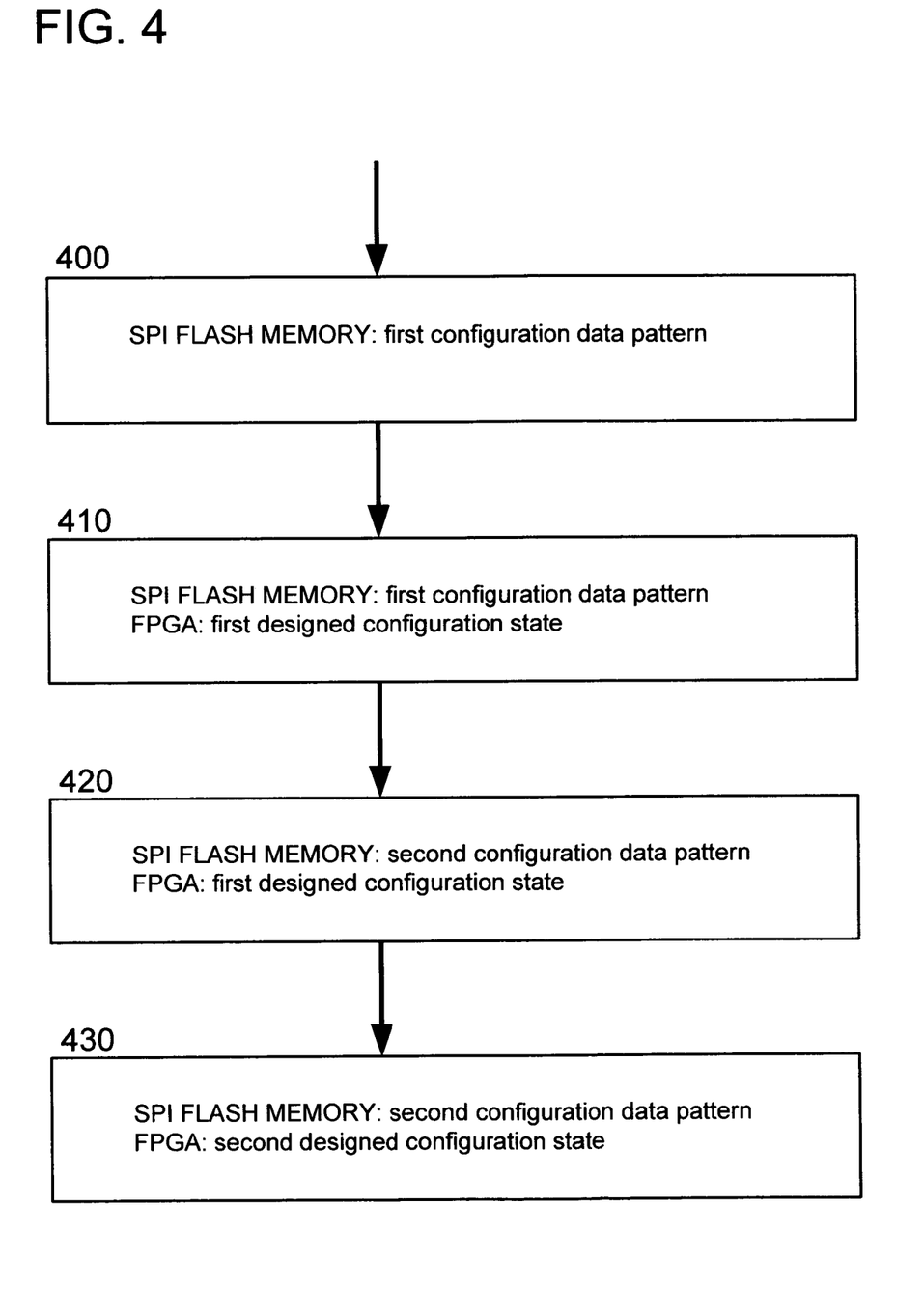
FIG. 4 is a flowchart diagram showing process steps for FPGA configuration from SPI flash memory.

The flowchart of FIG. 4 depicts some embodiments illustrative of the states of the SPI flash memory and a first FPGA and in some embodiments additional FPGAs. The SPI flash memory is initialized with a first configuration data pattern resulting in step 400. A first device configuration process is initiated, resulting in the FPGA achieving, and in some embodiments additional FPGAs each achieving, a designed configuration state in step 410. The SPI flash memory is then initialized with a second configuration data pattern resulting in step 420. In some embodiments the second initialization of the of the SPI flash memory is accomplished by means of a first FPGA which has already been suitably configured for this purpose. After step 420, a second device configuration process is then initiated, resulting in the FPGA achieving, and in some embodiments additional FPGAs each achieving, a designed configuration state in step 430.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

Accordingly, it is intended that the scope of the invention be defined by the following Claims and their equivalents.

What is claimed is:

1. A system for configuring a programmable logic device comprising:
   a first programmable logic device comprising a first serial data input;
   a shift register coupled with the first programmable logic device, the shift register comprising:
      a plurality of bits of register storage,
      a shift register serial data input,
      a shift register serial data output,
      a shift register clock input,
      a parallel-load enable input, and
      a parallel data input port; and
   a memory coupled with the first programmable logic device and the shift register;
   wherein the first programmable logic device is adapted to:
      provide a first clock signal,
      receive a program-start signal,
      at least partially provide a configuration-start signal, and
      at least partially provide a configuration-status signal;
   wherein the first serial data input is adapted to receive a first serial configuration data signal;
   wherein the shift register is adapted to receive an instruction value via the parallel data input port, store the instruction value in the plurality of bits of register storage, and transmit the instruction value via the shift register serial data output;
   wherein:
      the shift register serial data input is adapted to receive a first logic signal,
      the shift register serial data output is adapted to provide a shift register serial data output signal,
      the shift register clock input is adapted to receive the first clock signal,
      the parallel-load enable input is adapted to receive the configuration-start signal,
      the parallel data input port is adapted to receive an instruction value,
      the instruction value corresponds to a memory instruction, and
      the shift register is substantially separate from the first programmable logic device; and
   wherein the memory is adapted to:
      receive the configuration-status signal,
      receive the first clock signal,
      receive the shift register serial data output signal, and
      provide the first serial configuration data signal.

2. The system of claim 1 wherein:
   the first clock signal is responsive to the program-start signal;
   the program-start signal at least partially triggers a first device-configuration process;
   the configuration-start signal is responsive to the start of the first device-configuration process;
   the configuration-status signal is responsive to the pendency of the first device-configuration process;
   the shift register serial data output signal is responsive to the first clock signal, the first logic signal, the configuration-start signal, and the instruction value;
   the shift register serial data output signal comprises the memory instruction; and
   the serial configuration data signal comprises a bitstream, the bitstream at least indicative of a specified first configuration data pattern.

3. The system of claim 1 further comprising:
   the first programmable logic device further comprising a first serial data output; and
   one or more additional programmable logic devices, each of said one or more additional programmable logic devices comprising a serial data input node and a serial data output node;
   wherein each serial data input node is coupled with at least one of, the first serial data output and the serial data output nodes of the additional programmable logic devices, the programmable logic devices thereby forming a chain;
   wherein each of the one or more additional programmable logic devices is adapted to receive the first clock signal and the program-start signal; and
   wherein each of the one or more additional programmable logic devices is adapted to at least partially provide the configuration-status signal and the configuration-start signal.

4. The system of claim 3 wherein:
   the first clock signal is responsive to the program-start signal;
   the program-start signal at least partially triggers a first device-configuration process;
   the configuration-start signal is responsive to the start of the first device-configuration process;
   the configuration-status signal is responsive to the pendency of the first device-configuration process;
   the shift register serial data output signal is responsive to the first clock signal, the first logic signal, the configuration-start signal, and the instruction value;
   the shift register serial data output signal comprises the memory instruction; and
   the serial configuration data signal comprises a bitstream, the bitstream at least indicative of a specified first configuration data pattern.

5. The system of claim 1 further comprising:
   a bus buffer coupled with the first programmable logic device, the shift register, and the memory, the bus buffer comprising a buffer enable input;

wherein the buffer enable input is adapted to receive the configuration-start signal; and wherein the bus buffer is adapted to receive and selectively transmit the first clock signal, the shift register serial data output signal, and the configuration-status signal.

6. The system of claim 5 wherein:

the first clock signal is responsive to the program-start signal;

the program-start signal at least partially triggers a first device-configuration process;

the configuration-start signal is responsive to the start of the first device-configuration process;

the configuration-status signal is responsive to the pendency of the first device-configuration process;

the shift register serial data output signal is responsive to the first clock signal, the first logic signal, the configuration-start signal, and the instruction value;

the shift register serial data output signal comprises the memory instruction; and the serial configuration data signal comprises a bitstream, the bitstream at least indicative of a specified first configuration data pattern.

7. The system of claim 5 further comprising:

the first programmable logic device further comprising a first serial data output; and one or more additional programmable logic devices, each of said one or more additional programmable logic devices comprising a serial data input node and a serial data output node;

wherein each serial data input node is coupled with at least one of, the first serial data output and the serial data output nodes of the additional programmable logic devices, the programmable logic devices thereby forming a chain;

wherein each of the one or more additional programmable logic devices is adapted to receive the first clock signal and the program-start signal; and wherein each of the one or more additional programmable logic devices is adapted to at least partially provide the configuration-status signal and the configuration-start signal.

8. The system of claim 7 wherein:

the first clock signal is responsive to the program-start signal;

the program-start signal at least partially triggers a first device-configuration process; the configuration-start signal is responsive to the start of the first device-configuration process;

the configuration-status signal is responsive to the pendency of the first device-configuration process;

the shift register serial data output signal is responsive to the first clock signal, the first logic signal, the configuration-start signal, and the instruction value;

the shift register serial data output signal comprises the memory instruction; and the serial configuration data signal comprises a bitstream, the bitstream at least indicative of a specified first configuration data pattern.

9. A method for configuring a programmable logic device comprising the steps of:

providing a first programmable logic device having a first serial data input;

providing a shift register having a parallel input port, a plurality of bits of register storage, and a shift register serial data output;

coupling the shift register with the first programmable logic device;

providing a memory;

coupling the memory with the shift register and with the first programmable logic device;

providing a first configuration data pattern, the first configuration data pattern corresponding to a definition of a first designed configuration state of the first programmable logic device;

initializing the memory with the first configuration data pattern;

initiating a first device configuration process to configure the first programmable logic device with the first designed configuration state;

receiving an instruction value via the parallel data input port;

storing the instruction value in the plurality of bits of register storage;

providing a shift register serial data output signal via the shift register serial data output, the shift register serial data output signal comprising a memory instruction, and the memory instruction comprising the instruction value;

receiving the shift register serial data output signal to the memory;

providing a serial configuration data signal responsive to the shift register serial data output signal, the serial configuration data signal comprising a bitstream, the bitstream at least indicative of the first configuration data pattern; and receiving the serial configuration data signal via the first serial data input.

10. The method of claim 9 further comprising the steps of:

providing a second configuration data pattern, the second configuration data pattern corresponding to a definition of a second designed configuration state of the first programmable logic device;

initializing the memory with the second configuration data pattern by means of the first programmable logic device, after the first device configuration process and resulting configuration of the first programmable logic device with the first designed configuration state; and initiating a second device configuration process, after initializing the memory with the second configuration data pattern, to configure the first programmable logic device with the second designed configuration state.

11. The method of claim 9 further comprising the steps of:

providing a bus buffer;

coupling the bus buffer with the first programmable logic device, the shift register, and the memory; and the bus buffer receiving and selectively transmitting a plurality of signals, responsive to a configuration-start signal, the plurality of signals comprising the shift register serial data output signal.

12. The method of claim 11 further comprising the steps of:

providing a second configuration data pattern, the second configuration data pattern corresponding to a definition of a second designed configuration state of the first programmable logic device;

initializing the memory with the second configuration data pattern by means of the first programmable logic device, after the first device configuration process and resulting configuration of the first programmable logic device with the first designed configuration state; and initiating a second device configuration process, after initializing the memory with the second configuration data pattern, to configure the first programmable logic device with the second designed configuration state.

13. A method for configuring a programmable logic device comprising the steps of:
- providing a first programmable logic device having a first serial data input and a first serial data output;
- providing one or more additional programmable logic devices, each of said one or more additional programmable logic devices comprising a serial data input node and a serial data output node;
- coupling each serial data input node with at least one of, the first serial data output and the serial data output nodes of the additional programmable logic devices, the programmable logic devices thereby forming a chain;
- providing a shift register having a parallel input port, a plurality of bits of register storage, and a shift register serial data output;
- coupling the shift register with the first programmable logic device;
- providing a memory;
- coupling the memory with the shift register and with the first programmable logic device;
- providing a first configuration data pattern, the first configuration data pattern corresponding to a plurality of definitions of designed configuration states, each designed configuration state corresponding to one of the programmable logic devices in the chain, and each programmable logic device in the chain having a corresponding designed configuration state;
- initializing the memory with the first configuration data pattern;
- initiating a first device configuration process to configure each of said first programmable logic device and said one or more additional programmable logic devices with their said corresponding designed configuration state corresponding to said first configuration data pattern;
- receiving an instruction value via the parallel data input port;
- storing the instruction value in the plurality of bits of register storage;
- providing a shift register serial data output signal via the shift register serial data output, the shift register serial data output signal comprising a memory instruction, and the memory instruction comprising the instruction value;
- receiving the shift register serial data output signal to the memory;
- providing a serial configuration data signal responsive to the shift register serial data output signal, the serial configuration data signal comprising a bitstream, the bitstream at least indicative of the first configuration data pattern; and
- receiving the serial configuration data signal via the first serial data input.

14. The method of claim 13 further comprising the steps of:
- providing a second configuration data pattern, the second configuration data pattern mapping to a plurality of second definitions of designed configuration states, each designed configuration state corresponding to one of the programmable logic devices in the chain, and each programmable logic device in the chain having a corresponding designed configuration state;
- initializing the memory with the second configuration data pattern by means of the first programmable logic device, after the first device configuration process and resulting configuration of the programmable logic device chain with the first designed configuration state; and
- initiating a second device configuration process after initializing the memory with the second configuration data pattern to configure each of said first programmable logic device and said one or more additional programmable logic devices with their said corresponding designed configuration state corresponding to said second configuration data pattern.

15. The method of claim 13 further comprising the steps of:
- providing a bus buffer;
- coupling the bus buffer with the first programmable logic device, the shift register, and the memory; and
- the bus buffer receiving and selectively transmitting a plurality of signals, responsive to a configuration-start signal, the plurality of signals comprising the shift register serial data output signal.

16. The method of claim 15 further comprising the steps of:
- providing a second configuration data pattern, the second configuration data pattern mapping to a plurality of second definitions of designed configuration states, each designed configuration state corresponding to one of the programmable logic devices in the chain, and each programmable logic device in the chain having a corresponding designed configuration state;
- initializing the memory with the second configuration data pattern by means of the first programmable logic device, after the first device configuration process and resulting configuration of the programmable logic device chain with the first designed configuration state; and
- initiating a second device configuration process after initializing the memory with the second configuration data pattern to configure each of said first programmable logic device and said one or more additional programmable logic devices with their said corresponding designed configuration state corresponding to said second configuration data pattern.

* * * * *